(12) United States Patent
Uzoh et al.

(10) Patent No.: US 11,056,390 B2
(45) Date of Patent: Jul. 6, 2021

(54) STRUCTURES AND METHODS FOR RELIABLE PACKAGES

(71) Applicant: INVENSAS CORPORATION, San Jose, CA (US)

(72) Inventors: Cyprian Emeka Uzoh, San Jose, CA (US); Guilian Gao, San Jose, CA (US); Liang Wang, Milpitas, CA (US); Hong Shen, Palo Alto, CA (US); Arkalgud R. Sitaram, Cupertino, CA (US)

(73) Assignee: INVENSAS CORPORATION, San Jose, CA (US)

( * ) Notice: Subject to any disclaimer, the term of this patent is extended or adjusted under 35 U.S.C. 154(b) by 0 days.

(21) Appl. No.: 16/718,820

(22) Filed: Dec. 18, 2019

(65) Prior Publication Data

US 2020/0126861 A1 Apr. 23, 2020

Related U.S. Application Data

(60) Continuation of application No. 15/649,457, filed on Jul. 13, 2017, now Pat. No. 10,535,564, which is a
(Continued)

(51) Int. Cl.
*H01L 21/82* (2006.01)
*H01L 21/56* (2006.01)
(Continued)

(52) U.S. Cl.
CPC ............ *H01L 21/82* (2013.01); *H01L 21/486* (2013.01); *H01L 21/561* (2013.01);
(Continued)

(58) Field of Classification Search
CPC ......... H01L 21/82; H01L 24/92; H01L 24/19; H01L 24/94; H01L 21/486;
(Continued)

(56) References Cited

U.S. PATENT DOCUMENTS 4,467,342 A 8/1984 Tower
4,998,665 A 3/1991 Hayashi
(Continued)

FOREIGN PATENT DOCUMENTS

CN 103681646 3/2014
EP 0 065 425 A2 11/1982
(Continued)

OTHER PUBLICATIONS

Amirfeiz et al., "Formation of silicon structures by plasma-activated wafer bonding," Journal of The Electrochemical Society, 2000, vol. 147, No. 7, pp. 2693-2698.
(Continued)

*Primary Examiner* — Sheikh Maruf
(74) *Attorney, Agent, or Firm* — Knobbe, Martens, Olson & Bear LLP

(57) ABSTRACT

A device and method of forming the device that includes cavities formed in a substrate of a substrate device, the substrate device also including conductive vias formed in the substrate. Chip devices, wafers, and other substrate devices can be mounted to the substrate device. Encapsulation layers and materials may be formed over the substrate device in order to fill the cavities.

22 Claims, 9 Drawing Sheets

Related U.S. Application Data division of application No. 14/749,529, filed on Jun. 24, 2015, now Pat. No. 9,741,620.

(51) Int. Cl.
*H01L 23/00* (2006.01)
*H01L 21/48* (2006.01)
*H01L 23/538* (2006.01)
*H01L 23/31* (2006.01)

(52) U.S. Cl.
CPC ........ *H01L 23/5389* (2013.01); *H01L 23/562* (2013.01); *H01L 24/19* (2013.01); *H01L 24/92* (2013.01); *H01L 24/94* (2013.01); *H01L 24/96* (2013.01); *H01L 24/97* (2013.01); *H01L 24/98* (2013.01); *H01L 23/3128* (2013.01); *H01L 24/02* (2013.01); *H01L 24/27* (2013.01); *H01L 24/32* (2013.01); *H01L 2224/0231* (2013.01); *H01L 2224/04105* (2013.01); *H01L 2224/18* (2013.01); *H01L 2224/32146* (2013.01); *H01L 2224/92* (2013.01); *H01L 2224/94* (2013.01); *H01L 2224/96* (2013.01); *H01L 2224/97* (2013.01); *H01L 2924/157* (2013.01); *H01L 2924/15311* (2013.01); *H01L 2924/15313* (2013.01); *H01L 2924/15788* (2013.01); *H01L 2924/181* (2013.01); *H01L 2924/3511* (2013.01); *H01L 2924/3512* (2013.01)

(58) Field of Classification Search
CPC ... H01L 23/5389; H01L 23/562; H01L 24/97; H01L 21/561; H01L 24/96; H01L 24/98; H01L 2224/0231; H01L 2224/94; H01L 2224/32146; H01L 2224/18; H01L 2924/181; H01L 2224/96; H01L 2224/97; H01L 24/27; H01L 2224/04105; H01L 2224/92; H01L 24/02; H01L 24/32; H01L 23/3128; H01L 2924/15311; H01L 2924/15313; H01L 2924/157; H01L 2924/15788; H01L 2924/3511; H01L 2924/3512
USPC ....................................................... 257/506
See application file for complete search history.

(56) References Cited

U.S. PATENT DOCUMENTS

| | | | |
|---|---|---|---|
| 5,019,673 A | 5/1991 | Juskey et al. |
| 5,087,585 A | 2/1992 | Hayashi |
| 5,322,593 A | 6/1994 | Hasegawa et al. |
| 5,399,898 A | 3/1995 | Rostoker |
| 5,753,536 A | 5/1998 | Sugiyama et al. |
| 5,771,555 A | 6/1998 | Eda et al. |
| 5,956,605 A | 9/1999 | Akram et al. |
| 5,985,739 A | 11/1999 | Plettner et al. |
| 5,998,808 A | 12/1999 | Matsushita |
| 6,008,126 A | 12/1999 | Leedy |
| 6,080,640 A | 6/2000 | Gardner et al. |
| 6,121,688 A | 9/2000 | Akagawa |
| 6,265,775 B1 | 7/2001 | Seyyedy |
| 6,322,903 B1 | 11/2001 | Siniaguine et al. |
| 6,374,770 B1 | 4/2002 | Lee |
| 6,423,640 B1 | 7/2002 | Lee et al. |
| 6,437,434 B1 | 8/2002 | Sugizaki |
| 6,448,153 B2 | 9/2002 | Siniaguine |
| 6,465,892 B1 | 10/2002 | Suga |
| 6,582,991 B1 | 6/2003 | Maeda et al. |
| 6,887,769 B2 | 5/2005 | Kellar et al. |
| 6,908,027 B2 | 6/2005 | Tolchinsky et al. |
| 6,958,285 B2 | 10/2005 | Siniaguine |
| 6,964,915 B2 | 11/2005 | Farnworth et al. |
| 6,984,889 B2 | 1/2006 | Kimura |
| 7,045,453 B2 | 5/2006 | Canaperi et al. |
| 7,078,811 B2 | 7/2006 | Suga |
| 7,098,542 B1 | 8/2006 | Hoang et al. |
| 7,105,980 B2 | 9/2006 | Abbott et al. |
| 7,126,212 B2 | 10/2006 | Enquist et al. |
| 7,193,423 B1 | 3/2007 | Dalton et al. |
| 7,354,798 B2 | 4/2008 | Pogge et al. |
| 7,452,743 B2 | 11/2008 | Oliver et al. |
| 7,750,488 B2 | 7/2010 | Patti et al. |
| 7,803,693 B2 | 9/2010 | Trezza |
| 7,902,643 B2 | 3/2011 | Tuttle |
| 8,008,764 B2 | 8/2011 | Joseph et al. |
| 8,178,963 B2 | 5/2012 | Yang |
| 8,178,964 B2 | 5/2012 | Yang |
| 8,183,127 B2 | 5/2012 | Patti et al. |
| 8,237,289 B2 | 8/2012 | Urakawa |
| 8,241,961 B2 | 8/2012 | Kim et al. |
| 8,258,633 B2 | 9/2012 | Sezi et al. |
| 8,314,007 B2 | 11/2012 | Vaufredaz |
| 8,349,635 B1 | 1/2013 | Gan et al. |
| 8,377,798 B2 | 2/2013 | Peng et al. |
| 8,409,927 B1 | 4/2013 | Yim |
| 8,441,131 B2 | 5/2013 | Ryan |
| 8,476,146 B2 | 7/2013 | Chen et al. |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,524,533 B2 | 9/2013 | Tong et al. |
| 8,536,693 B2 | 9/2013 | Dungan et al. |
| 8,618,659 B2 | 12/2013 | Sato et al. |
| 8,620,164 B2 | 12/2013 | Heck et al. |
| 8,647,987 B2 | 2/2014 | Yang et al. |
| 8,697,493 B2 | 4/2014 | Sadaka |
| 8,703,542 B2 | 4/2014 | Lin et al. |
| 8,704,364 B2 | 4/2014 | Banijamali |
| 8,704,384 B2 | 4/2014 | Wu et al. |
| 8,710,648 B2 | 4/2014 | Xue |
| 8,716,105 B2 | 5/2014 | Sadaka et al. |
| 8,802,538 B1 | 8/2014 | Liu |
| 8,809,123 B2 | 8/2014 | Liu et al. |
| 8,810,006 B2 | 8/2014 | Yu et al. |
| 8,816,404 B2 | 8/2014 | Kim et al. |
| 8,841,002 B2 | 9/2014 | Tong |
| 8,872,349 B2 | 10/2014 | Chiu et al. |
| 8,912,648 B2 | 12/2014 | Lin et al. |
| 8,988,299 B2 | 3/2015 | Kam et al. |
| 9,006,873 B2 | 4/2015 | Nikitin et al. |
| 9,018,094 B2 | 4/2015 | Kosenko et al. |
| 9,048,306 B2 | 6/2015 | Chi et al. |
| 9,093,350 B2 | 7/2015 | Endo et al. |
| 9,136,219 B2 | 9/2015 | Iwase et al. |
| 9,142,517 B2 | 9/2015 | Liu |
| 9,171,756 B2 | 10/2015 | Enquist et al. |
| 9,184,104 B1 | 11/2015 | Chia et al. |
| 9,184,125 B2 | 11/2015 | Enquist et al. |
| 9,202,769 B2 | 12/2015 | Lin et al. |
| 9,224,669 B2 | 12/2015 | Xue |
| 9,224,704 B2 | 12/2015 | Landru |
| 9,230,941 B2 | 1/2016 | Chen et al. |
| 9,257,399 B2 | 2/2016 | Kuang et al. |
| 9,299,736 B2 | 3/2016 | Chen et al. |
| 9,312,229 B2 | 4/2016 | Chen et al. |
| 9,331,149 B2 | 5/2016 | Tong et al. |
| 9,337,235 B2 | 5/2016 | Chen et al. |
| 9,355,997 B2 | 5/2016 | Katkar et al. |
| 9,368,563 B2 | 6/2016 | Lin et al. |
| 9,368,866 B2 | 6/2016 | Yu |
| 9,379,091 B2 | 6/2016 | England et al. |
| 9,385,024 B2 | 7/2016 | Tong et al. |
| 9,394,161 B2 | 7/2016 | Cheng et al. |
| 9,402,312 B2 | 7/2016 | Shen et al. |
| 9,412,662 B2 | 8/2016 | Lin et al. |
| 9,437,572 B2 | 9/2016 | Chen et al. |
| 9,443,796 B2 | 9/2016 | Chou et al. |
| 9,461,007 B2 | 10/2016 | Chun et al. |
| 9,466,586 B1 | 10/2016 | Choi et al. |
| 9,496,239 B1 | 11/2016 | Edelstein et al. |
| 9,536,848 B2 | 1/2017 | England et al. |
| 9,559,081 B1 | 1/2017 | Lai et al. |

(56) References Cited

U.S. PATENT DOCUMENTS

| | | |
|---|---|---|
| 9,620,481 B2 | 4/2017 | Edelstein et al. |
| 9,656,852 B2 | 5/2017 | Cheng et al. |
| 9,704,824 B2 | 7/2017 | Lin et al. |
| 9,722,098 B1 | 8/2017 | Chung et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,799,587 B2 | 10/2017 | Fujii et al. |
| 9,852,988 B2 | 12/2017 | Enquist et al. |
| 9,881,882 B2 | 1/2018 | Hsu et al. |
| 9,893,004 B2 | 2/2018 | Yazdani |
| 9,929,050 B2 | 3/2018 | Lin |
| 9,941,241 B2 | 4/2018 | Edelstein et al. |
| 9,941,243 B2 | 4/2018 | Kim et al. |
| 9,953,941 B2 | 4/2018 | Enquist |
| 9,960,142 B2 | 5/2018 | Chen et al. |
| 10,008,844 B2 | 6/2018 | Wang et al. |
| 10,026,605 B2 | 7/2018 | Doub et al. |
| 10,075,657 B2 | 9/2018 | Fahim et al. |
| 10,204,893 B2 | 2/2019 | Uzoh et al. |
| 10,269,756 B2 | 4/2019 | Uzoh |
| 10,276,619 B2 | 4/2019 | Kao et al. |
| 10,276,909 B2 | 4/2019 | Huang et al. |
| 10,446,456 B2 | 10/2019 | Shen et al. |
| 10,727,219 B2 | 7/2020 | Uzoh et al. |
| 2002/0000328 A1 | 1/2002 | Motomura et al. |
| 2002/0003307 A1 | 1/2002 | Suga |
| 2002/0004288 A1 | 1/2002 | Nishiyama |
| 2004/0070045 A1 | 4/2004 | Suguro et al. |
| 2004/0084414 A1 | 5/2004 | Sakai et al. |
| 2004/0238927 A1 | 12/2004 | Miyazawa |
| 2005/0040530 A1 | 2/2005 | Shi |
| 2005/0153522 A1 | 7/2005 | Hwang et al. |
| 2006/0057945 A1 | 3/2006 | Hsu et al. |
| 2007/0045798 A1 | 3/2007 | Horie et al. |
| 2007/0096294 A1 | 5/2007 | Ikeda et al. |
| 2007/0111386 A1 | 5/2007 | Kim et al. |
| 2007/0158024 A1 | 7/2007 | Addison et al. |
| 2007/0222048 A1 | 9/2007 | Huang |
| 2007/0295456 A1 | 12/2007 | Gudeman et al. |
| 2008/0237782 A1 | 10/2008 | Williams et al. |
| 2008/0244902 A1 | 10/2008 | Blackwell et al. |
| 2008/0265421 A1 | 10/2008 | Brunnbauer et al. |
| 2009/0039523 A1 | 2/2009 | Jiang et al. |
| 2009/0068831 A1 | 3/2009 | Enquist et al. |
| 2009/0072357 A1 | 3/2009 | Tang et al. |
| 2009/0102002 A1 | 4/2009 | Chia et al. |
| 2009/0149023 A1 | 6/2009 | Koyanagi |
| 2009/0227089 A1* | 9/2009 | Plaut .................. H01L 21/6836 438/464 |
| 2009/0252939 A1* | 10/2009 | Park ..................... H01L 21/187 428/212 |
| 2009/0283898 A1* | 11/2009 | Janzen ................. H01L 23/525 257/698 |
| 2010/0123268 A1 | 5/2010 | Menard |
| 2010/0176482 A1 | 7/2010 | Dennard et al. |
| 2010/0213603 A1 | 8/2010 | Smeys et al. |
| 2010/0225005 A1 | 9/2010 | Nishio et al. |
| 2010/0230806 A1 | 9/2010 | Huang et al. |
| 2010/0314741 A1 | 12/2010 | Lee et al. |
| 2011/0062549 A1 | 3/2011 | Lin |
| 2011/0074033 A1* | 3/2011 | Kaltalioglu ............. H01L 21/78 257/758 |
| 2011/0095403 A1 | 4/2011 | Lee et al. |
| 2011/0108943 A1 | 5/2011 | Dennard et al. |
| 2011/0163457 A1 | 7/2011 | Mohan et al. |
| 2011/0290552 A1 | 12/2011 | Palmateer et al. |
| 2012/0001339 A1* | 1/2012 | Malatkar ........... H01L 23/49838 257/773 |
| 2012/0049332 A1* | 3/2012 | Chen .................. H01L 25/0657 257/632 |
| 2012/0212384 A1 | 8/2012 | Kam et al. |
| 2012/0319300 A1 | 12/2012 | Kim et al. |
| 2013/0037962 A1* | 2/2013 | Xue ...................... H01L 24/96 257/774 |
| 2013/0069239 A1 | 3/2013 | Kim et al. |
| 2013/0122655 A1 | 5/2013 | Yu et al. |
| 2013/0161836 A1 | 6/2013 | Yeom et al. |
| 2013/0187292 A1* | 7/2013 | Semmelmeyer ....... H05K 1/144 257/777 |
| 2013/0217188 A1 | 8/2013 | Wang et al. |
| 2013/0249045 A1 | 9/2013 | Kang et al. |
| 2013/0249106 A1 | 9/2013 | Lin et al. |
| 2013/0299997 A1* | 11/2013 | Sadaka ............... H01L 23/5384 257/774 |
| 2013/0320572 A1 | 12/2013 | Chang et al. |
| 2014/0001652 A1 | 1/2014 | Chen et al. |
| 2014/0013606 A1 | 1/2014 | Nah et al. |
| 2014/0015109 A1 | 1/2014 | Lei et al. |
| 2014/0124957 A1* | 5/2014 | Iwase ................. H01L 25/0652 257/777 |
| 2014/0134804 A1* | 5/2014 | Kelly ................ H01L 21/68735 438/118 |
| 2014/0154839 A1 | 6/2014 | Ahn et al. |
| 2014/0175655 A1 | 6/2014 | Chen et al. |
| 2014/0225246 A1 | 8/2014 | Henderson et al. |
| 2014/0225795 A1 | 8/2014 | Yu |
| 2014/0299981 A1 | 10/2014 | Goh et al. |
| 2014/0312511 A1* | 10/2014 | Nakamura ............... H01L 24/92 257/777 |
| 2014/0370658 A1 | 12/2014 | Tong et al. |
| 2015/0021754 A1* | 1/2015 | Lin .................... H01L 23/5389 257/712 |
| 2015/0041980 A1 | 2/2015 | Ahn et al. |
| 2015/0064498 A1 | 3/2015 | Tong |
| 2015/0102468 A1 | 4/2015 | Kang et al. |
| 2015/0115448 A1 | 4/2015 | Maier |
| 2015/0123240 A1* | 5/2015 | Bowman ............... H01L 29/732 257/506 |
| 2015/0179481 A1 | 6/2015 | Lin |
| 2015/0228632 A1* | 8/2015 | Yu ...................... H01L 21/768 257/704 |
| 2015/0262928 A1 | 9/2015 | Shen et al. |
| 2015/0303170 A1 | 10/2015 | Kim et al. |
| 2015/0327367 A1* | 11/2015 | Shen ................... H01L 23/498 361/767 |
| 2015/0340285 A1 | 11/2015 | Enquest et al. |
| 2016/0020193 A1 | 1/2016 | Lee et al. |
| 2016/0042998 A1 | 2/2016 | Pueschner et al. |
| 2016/0133571 A1 | 5/2016 | Lee et al. |
| 2016/0172302 A1* | 6/2016 | Song ................... H01L 23/552 257/693 |
| 2016/0247761 A1 | 8/2016 | Song et al. |
| 2016/0300817 A1 | 10/2016 | Do et al. |
| 2016/0343682 A1 | 11/2016 | Kawasaki |
| 2016/0379885 A1 | 12/2016 | Uzoh et al. |
| 2017/0148764 A1 | 5/2017 | Wang et al. |
| 2017/0194271 A1 | 7/2017 | Hsu et al. |
| 2017/0200711 A1 | 7/2017 | Uzoh et al. |
| 2017/0316998 A1 | 11/2017 | Marutani et al. |
| 2018/0012787 A1* | 1/2018 | Oka ...................... H01L 24/27 |
| 2018/0096931 A1 | 4/2018 | Huang et al. |
| 2018/0122774 A1 | 5/2018 | Huang et al. |
| 2018/0130769 A1 | 5/2018 | Tan et al. |
| 2018/0175012 A1 | 6/2018 | Wu et al. |
| 2018/0182639 A1 | 6/2018 | Uzoh et al. |
| 2018/0182666 A1* | 6/2018 | Uzoh ...................... C23F 3/00 |
| 2018/0190580 A1 | 7/2018 | Haba et al. |
| 2018/0190583 A1 | 7/2018 | DeLaCruz et al. |
| 2018/0219038 A1* | 8/2018 | Gambino .......... H01L 27/14618 |
| 2018/0226375 A1 | 8/2018 | Enquist et al. |
| 2018/0273377 A1 | 9/2018 | Katkar et al. |
| 2018/0286805 A1 | 10/2018 | Huang et al. |
| 2018/0323177 A1* | 11/2018 | Yu ........................ H01L 24/09 |
| 2018/0323227 A1 | 11/2018 | Zhang et al. |
| 2018/0331066 A1 | 11/2018 | Uzoh et al. |
| 2018/0366442 A1 | 12/2018 | Gu et al. |
| 2018/0366446 A1 | 12/2018 | Haba et al. |
| 2019/0096741 A1 | 3/2019 | Uzoh et al. |
| 2019/0096842 A1 | 3/2019 | Fountain, Jr. et al. |
| 2019/0115277 A1* | 4/2019 | Yu ....................... H01L 23/538 |

(56) References Cited

U.S. PATENT DOCUMENTS

| | | | |
|---|---|---|---|
| 2019/0131277 A1* | 5/2019 | Yang | H01L 23/3135 |
| 2019/0198407 A1 | 6/2019 | Huang et al. | |
| 2019/0198409 A1 | 6/2019 | Katkar et al. | |
| 2019/0265411 A1 | 8/2019 | Huang et al. | |
| 2019/0333550 A1 | 10/2019 | Fisch | |
| 2019/0348336 A1 | 11/2019 | Katkar et al. | |
| 2019/0371763 A1 | 12/2019 | Agarwal et al. | |
| 2019/0385966 A1 | 12/2019 | Gao et al. | |
| 2020/0013637 A1 | 1/2020 | Haba | |
| 2020/0075534 A1 | 3/2020 | Gao et al. | |
| 2020/0126906 A1 | 4/2020 | Uzoh et al. | |
| 2020/0194396 A1 | 6/2020 | Uzoh | |
| 2020/0227367 A1 | 7/2020 | Haba et al. | |
| 2020/0294908 A1 | 9/2020 | Haba et al. | |
| 2020/0328162 A1 | 10/2020 | Haba et al. | |
| 2020/0328164 A1 | 10/2020 | DeLaCruz et al. | |
| 2020/0328165 A1 | 10/2020 | DeLaCruz et al. | |
| 2020/0371154 A1 | 11/2020 | DeLaCruz et al. | |
| 2020/0395321 A1 | 12/2020 | Katkar et al. | |

FOREIGN PATENT DOCUMENTS

| | | |
|---|---|---|
| EP | 2 685 491 A2 | 1/2014 |
| JP | 04-337694 | 11/1992 |
| JP | H11-135675 A2 | 5/1999 |
| JP | 2000-100679 | 4/2000 |
| JP | 2001-102479 | 4/2001 |
| JP | 2002-353416 | 12/2002 |
| JP | 2004-193493 | 7/2004 |
| JP | 2011-171614 | 9/2011 |
| JP | 2013-33786 | 2/2013 |
| JP | 2018-160519 | 10/2018 |
| KR | 10-2001-0104643 | 11/2001 |
| KR | 10-2010-0123755 | 11/2010 |
| KR | 10-2015-0097798 | 8/2015 |
| WO | WO 02/34019 A1 | 4/2002 |
| WO | WO 2005/043584 A2 | 5/2005 |
| WO | WO 2006/100444 A1 | 9/2006 |
| WO | WO 2010/024678 A1 | 3/2010 |
| WO | WO 2013/119309 A1 | 8/2013 |
| WO | WO 2017/034654 A1 | 3/2017 |
| WO | WO 2017/052652 A1 | 3/2017 |
| WO | WO 2017/151442 A1 | 9/2017 |

OTHER PUBLICATIONS

Chinese Office Action dated Jun. 5, 2019, in Chinese Application No. 201780030482.7, 10 pages.
Chung et al., "Room temperature GaAseu + Si and InPeu + Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.
Chung et al., "Wafer direct bonding of compound semiconductors and silicon at room temperature by the surface activated bonding method," Applied Surface Science, Jun. 2, 1997, vols. 117-118, pp. 808-812.
Farrens et al., "Chemical free room temperature wafer to wafer direct bonding," J. Electrochem. Soc., The Electrochemical Society, Inc., Nov. 1995, vol. 142, No. 11. pp. 3949-3955.
Farrens et al., "Chemical free wafer bonding of silicon to glass and sapphire," Electrochemical Society Proceedings vol. 95-7, 1995, pp. 72-77.
Fukushima, T. et al., "New three-dimensional integration technology using self-assembly technique," International Electron Devices Meeting 5-7.12.2005, IEEE, Dec. 5, 2005, pp. 348-351.
Gösele et al., "Semiconductor Wafer Bonding: A flexible approach to materials combinations in microelectronics; micromechanics and optoelectronics," IEEE, 1997, pp. 23-32.
Hosoda et al., "Effect of the surface treatment on the room-temperature bonding of Al to Si and SiO2," Journal of Materials Science, Jan. 1, 1998, vol. 33, Issue 1, pp. 253-258.
Hosoda et al., "Room temperature GaAs—Si and InP—Si wafer direct bonding by the surface activated bonding method," Nuclear Inst. And Methods in Physics Research B, 1997, vol. 121, Nos. 1-4, pp. 203-206.
Howlader et al., "A novel method for bonding of ionic wafers," Electronics Components and Technology Conference, 2006, IEEE, pp. 7-pp.
Howlader et al., "Bonding of p-Si/n-InP wafers through surface activated bonding method at room temperature," Indium Phosphide and Related Materials, 2001, IEEE International Conference On, pp. 272-275.
Howlader et al., "Characterization of the bonding strength and interface current of p-Si/ n-InP wafers bonded by surface activated bonding method at room temperature," Journal of Applied Physics, Mar. 1, 2002, vol. 91, No. 5, pp. 3062-3066.
Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.
International Search Report and Written Opinion dated Apr. 17, 2017, issued in International Application No. PCT/US2016/068577, 16 pages.
International Search Report and Written Opinion dated Sep. 22, 2017, issued in International Application No. PCT/US2017/029187, 20 pages.
International Search Report and Written Opinion dated Mar. 7, 2019, in International Application No. PCT/US2018/060044, 14 pages.
International Search Report and Written Opinion dated Apr. 22, 2019 in International Application No. PCT/US2018/064982, 13 pages.
International Search Report and Written Opinion dated Oct. 25, 2019, issued in International Application No. PCT/US2019/040622, 12 pages.
Itoh et al., "Characteristics of fritting contacts utilized for micromachined wafer probe cards," 2000 American Institute of Physics, AIP Review of Scientific Instruments, vol. 71, 2000, pp. 2224.
Itoh et al., "Characteristics of low force contact process for MEMS probe cards," Sensors and Actuators A: Physical, Apr. 1, 2002, vols. 97-98, pp. 462-467.
Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.
Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.
Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.
Kim et al., "Low temperature direct Cu—Cu bonding with low energy ion activation method," Electronic Materials and Packaging, 2001, IEEE, pp. 193-195.
Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.
Kim et al., "Wafer-scale activated bonding of Cu—Cu, Cu—Si, and Cu—SiO2 at low temperature," Proceedings—Electrochemical Society, 2003, vol. 19, pp. 239-247.
Marinov, Val et al., "Laser-enabled advanced packaging of ultrathin bare dice in flexible substrates," IEEE Transactions on Components, Packaging and Manufacturing Technology, Apr. 2012, vol. 2, No. 4, pp. 569-577.
Matsuzawa et al., "Room-temperature interconnection of electroplated Au microbump by means of surface activated bonding method," Electornic Components and Technology Conferencee, 2001, 51st Proceedings, IEEE, pp. 384-387.

(56) References Cited

OTHER PUBLICATIONS

Moriceau, H. et al., "Overview of recent direct wafer bonding advances and applications," Advances in Natural Sciences—Nanoscience and Nanotechnology, 2010, 11 pages.
Nakanishi, H. et al., "Studies on SiO2—SiO2 bonding with hydrofluoric acid. Room temperature and low stress bonding technique for MEMS," Sensors and Actuators, 2000, vol. 79, pp. 237-244.
Oberhammer, J. et al., "Sealing of adhesive bonded devices on wafer level," Sensors and Actuators A, 2004, vol. 110, No. 1-3, pp. 407-412, see pp. 407-412, and Figures 1(a)-1(l), 6 pages.
Office Action for U.S. Appl. No. 15/159,649, dated Sep. 14, 2017, 9 pages.
Office Action for U.S. Appl. No. 15/389,157, dated Oct. 6, 2017, 18 pages.
Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.
Plobi, A. et al., "Wafer direct bonding: tailoring adhesion between brittle materials," Materials Science and Engineering Review Journal, 1999, R25, 88 pages.
Reiche et al., "The effect of a plasma pretreatment on the Si/Si bonding behaviouir," Electrochemical Society Proceedings, 1998, vol. 97-36, pp. 437-444.
Roberds et al., "Low temperature , in situ, plasma activated wafer bonding," Electrochecmical Society Proceedings, 1997, vol. 97-36, pp. 598-606.
Shigetou et al., "Room temperature bonding of ultra-fine pitch and low-profiled Cu electrodes for bump-less interconnect," 2003 Electronic Components and Technology Conference, pp. 848-852.
Shigetou et al., "Room-temperature direct bonding of CMP-Cu film for bumpless interconnection," Electronic Components and Technology Confererence, 51st Proceedings, 2001, IEEE, pp. 755-760.
Shingo et al., "Design and fabrication of an electrostatically actuated MEMS probe card," Tranducers, Solid-State Sensors, Actuators and Microsystems, 12th International Conference, Jun. 8-12, 2003, vol. 2, pp. 1522-1525.
Suga et al., "A new approach to Cu—Cu direct bump bonding," IEMT/IMC Symposium, 1997, Joint International Electronic Manufacturing Symposium and the International Microelectronics Conference, Apr. 16-18, 1997, IEEE, pp. 146-151.
Suga et al., "A new bumping process using lead-free solder paste," Electronics Packaging Manufacturing, IEEE Transactions on (vol. 25, Issue 4), IEEE, Oct. 2002, pp. 253-256.
Suga et al., "A new wafer-bonder of ultra-high precision using surface activated bonding (SAB) concept," Electronic Components and Technology Conference, 2001, IEEE, pp. 1013-1018.
Suga et al., "Bump-less interconnect for next generation system packaging," Electronic Components and Technology Conference, 2001, IEEE, pp. 1003-1008.
Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.
Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.
Suga et al., "Surface activated bonding—an approach to joining at room temperature," Ceramic Transactions: Structural Ceramics Joining II, The American Ceramic Society, 1993, pp. 323-331.
Suga et al., "Surface activated bonding for new flip chip and bumpless interconnect systems," Electronic Components and Technology Conference, 2002, IEEE, pp. 105-111.
Suga, "UHV room temperature joining by the surface activated bonding method," Advances in science and technology, Techna, Faenza, Italie, 1999, pp. C1079-C1089.

Supplemental European Search Report dated Jun. 19, 2019 in European Application No. 17799846.5, 16 pages.
Takagi et al., "Effect of surface roughness on room-temperature wafer bonding by Ar beam surface activation," Japanese Journal of Applied Physics, 1998, vol. 37, Part 1, No. 1, pp. 4197.
Takagi et al., "Low temperature direct bonding of silicon and silicon dioxide by the surface activation method," Solid State Sensors and Actuators, 1997, Transducers '97 Chicago, 1997 International Conference, vol. 1, pp. 657-660.
Takagi et al., "Room-temperature bonding of lithium niobate and silicon wafers by argon-beam surface activation," Appl. Phys. Lett., 1999. vol. 74, pp. 2387.
Takagi et al., "Room temperature silicon wafer direct bonding in vacuum by Ar beam irradiation," Micro Electro Mehcanical Systems, MEMS '97 Proceedings, 1997, IEEE, pp. 191-196.
Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.
Takagi et al., "Room-temperature wafer bonding of silicon and lithium niobate by means of arbon-beam surface activation," Integrated Ferroelectrics: An International Journal, 2002, vol. 50, Issue 1, pp. 53-59.
Takagi et al., "Surface activated bonding silicon wafers at room temperature," Appl. Phys. Lett. 68, 2222 (1996).
Takagi et al, "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.
Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.
Tong et al., "Low temperature wafer direct bonding," Journal of Microelectomechanical systems, Mar. 1994, vol. 3, No. 1, pp. 29-35.
Topol et al., "Enabling technologies for wafer-level bonding of 3D MEMS and integrated circuit structures," 2004 Electronics Components and Technology Conference, 2004 IEEE, pp. 931-938.
Uhrmann, T. et al., "Heterogeneous integration by collective die-to-wafer bonding," Chip Scale Review, Nov./Dec. 2018, vol. 22, No. 6, pp. 10-12.
Wang et al., "Reliability and microstructure of Au—Al and Au—Cu direct bonding fabricated by the Surface Activated Bonding," Electronic Components and Technology Conference, 2002, IEEE, pp. 915-919.
Wang et al., "Reliability of Au bump—Cu direct interconnections fabricated by means of surface activated bonding method," Microelectronics Reliability, May 2003, vol. 43, Issue 5, pp. 751-756.
Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.
Xu et al., "New Au—Al interconnect technology and its reliability by surface activated bonding," Electronic Packaging Technology Proceedings, Oct. 28-30, 2003, Shanghai, China, pp. 479-483.
Ceramic Microstructures: Control at the Atomic Level, Recent Progress in Surface Activated Bonding, 1998, pp. 385-389.
European Patent Office, Patent Abstracts of Japan for H11-135675, 1999, 1 page.
International Search Report and Written Opinion dated Aug. 27, 2015, International Application No. PCT/US2015/030416, 11 pages.
International Search Report and Written Opinion dated Mar. 13, 2017, International Application No. PCT/US2016/037430, 15 pages.
U.S. Appl. No. 14/214,365, titled "Integrated Circuits Protected by Substrates with Cavities, and Methods of Manufacture," filed Mar. 14, 2014, 40 pages.

\* cited by examiner

STRUCTURES AND METHODS FOR RELIABLE PACKAGES

CROSS-REFERENCE TO RELATED APPLICATION(S)

This application is a continuation of, and hereby claims priority to, pending U.S. patent application Ser. No. 15/649,457, filed on Jul. 13, 2017, which is a divisional of, and claims priority to, U.S. patent application Ser. No. 14/749,529, filed on Jun. 24, 2015, issued as U.S. Pat. No. 9,741,620, the entirety of each of which is hereby incorporated by reference herein for all purposes.

TECHNICAL FIELD

Embodiments of the present invention relate to structures of reliable packages.

DISCUSSION OF RELATED ART

Thin wafer handling in 2.5D and 3D technologies adds cost and complexity in assembly. In particular, wafer bow and cracking of thin wafers, including the interposer, can cause great difficulty during assembly. Current Chip-on-Wafer-on-Substrate (CoWoS) technologies also face challenges with wafer bow and interposer cracking during fabrication. Furthermore, thermal issues in 2.5D and 3D technologies may also lead to warpage and cracking of the components.

Therefore, there is a need for better management of the assembly of packages.

SUMMARY

In accordance with aspects of the present invention a method of forming a device includes etching one or more crack arresting cavities in a first side of a substrate device to form crack arrests, the substrate device including conductive vias formed in a substrate; mounting chip devices to the first side of the substrate device to electrically contact the vias; depositing an encapsulation layer over the chip devices and filling the crack arrests cavities; planarizing a second side to reveal the vias on the second side; and singulating through the cavities to form separated packages, with each package having one or more chip devices mounted on each singulated substrate device.

In some embodiments, a method of forming a device includes mounting a wafer to a first side of the substrate device to electrically contact with conducting vias formed in the substrate device; planarizing a second side of the substrate device to reveal the conducting vias on the second side; etching one or more cavities in the second side of the substrate; depositing an encapsulation layer on the side side of the substrate; and singulating through the cavities to form separated packages, with each package having one or more chip devices mounted on each singulated substrate device.

In some embodiments, a device can include a substrate device with conductive vias formed in a substrate, the conductive vias being exposed on a second side of the substrate; cavities formed in the substrate device; chip devices mounted to a first side of the substrate device in electrical contact with the conductive vias; and an encapsulation layer covering the chip devices and filling the cavities.

In some embodiments, a device can include a substrate device with conductive vias formed in a substrate, the conductive vias being exposed on a second side of the substrate; a wafer mounted on a first side; cavities formed in the substrate device; and an encapsulation layer covering the second side and filling the cavities.

These and other embodiments are further discussed below with respect to the following figures.

DETAILED DESCRIPTION

Figure 1:
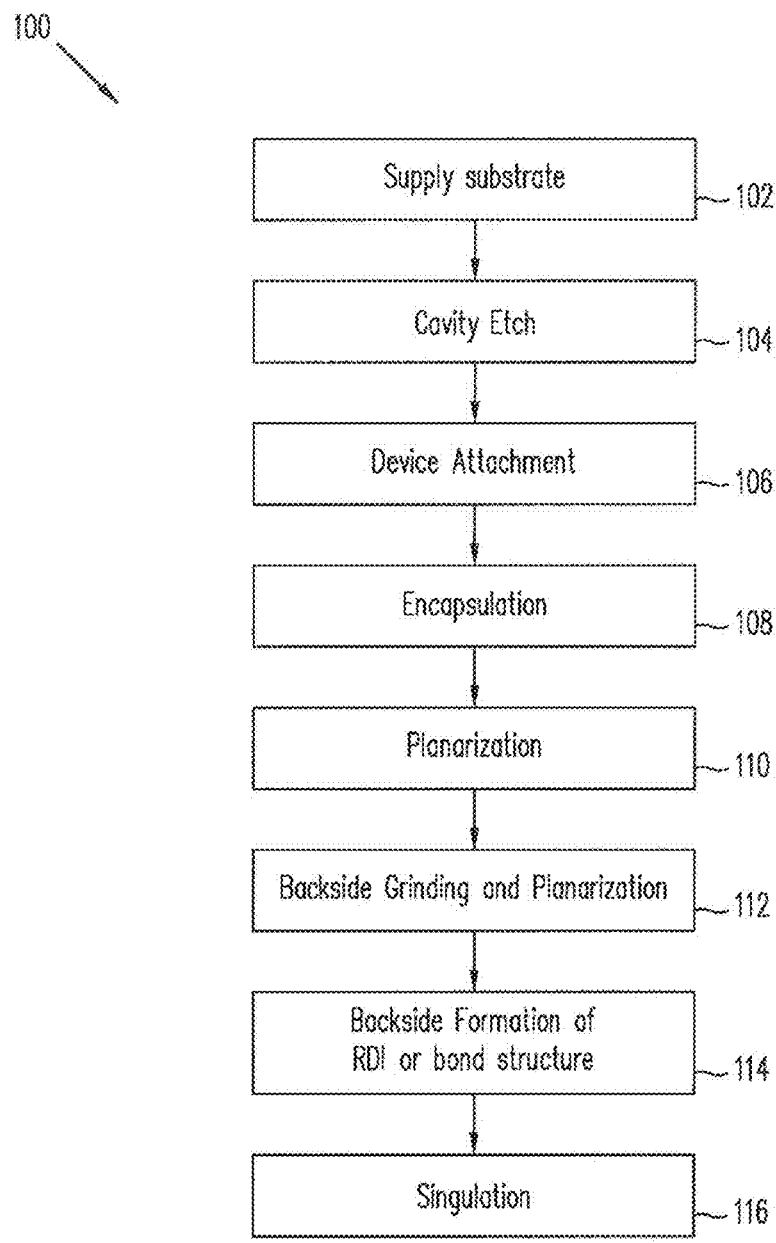
FIG. 1 illustrates a process of assembly according to some embodiments of the present invention.

In the following description, specific details are set forth describing some embodiments of the present invention. It will be apparent, however, to one skilled in the art that some embodiments may be practiced without some or all of these specific details. The specific embodiments disclosed herein are meant to be illustrative but not limiting. One skilled in the art may realize other elements that, although not specifically described here, are within the scope and the spirit of this disclosure.

This description and the accompanying drawings that illustrate inventive aspects and embodiments should not be taken as limiting—the claims define the protected invention. Various mechanical, compositional, structural, and operational changes may be made without departing from the spirit and scope of this description and the claims. In some instances, well-known structures and techniques have not been shown or described in detail in order not to obscure the invention.

Additionally, the drawings are not to scale. Relative sizes of components are for illustrative purposes only and do not reflect the actual sizes that may occur in any actual embodiment of the invention. Like numbers in two or more figures represent the same or similar elements. Further, descriptive elements such as "above" or "below" are relative to the other elements of the drawing on the drawing page and are not meant to denote absolute directionality. For example, a film described as being above a substrate may, when the substrate is turned over, actually be below the substrate. Therefore, terms such as "above" and 'below" should not be interpreted as limiting but as providing only relative positioning.

Assembly according to some embodiments of the present invention can lead to encapsulation and isolation of devices throughout the assembly. In such cases, there can be little or no thin wafer handling concerns and thermal management can be enhanced. In some embodiments, crack propagation within the wafer or substrate can be arrested. Further, assembly processes according to some embodiments can be highly scalable to large devices or interposer structures.

Figure 2A:
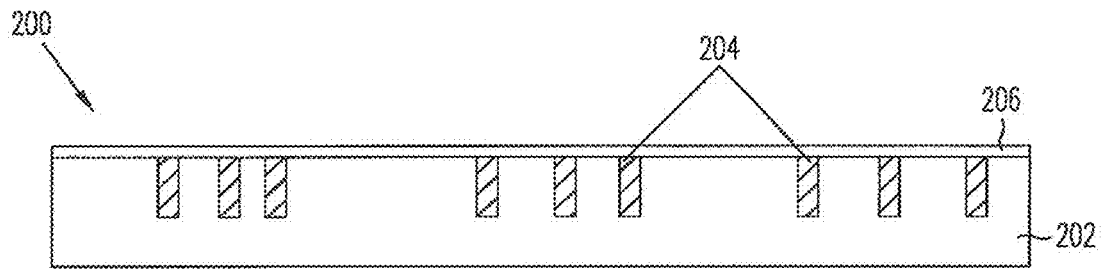
FIGS. 2A through 2M illustrate further the process of assembly illustrated in FIG. 1.

FIG. 1 illustrates a process 100 for providing a package. As shown in FIG. 1, a substrate device is supplied in step 102. As shown in FIG. 2A, substrate device 200 includes a substrate 202 with through-vias 204 formed in substrate 202. A redistribution layer (RDL) or back end-of-line layer (BEOL) 206 can be formed over substrate 202 and can be in contact with vias 204. In some embodiments, substrate 202 can be silicon or glass. Vias 204 can be through-silicon-vias (TSV)s formed with metallization materials.

Figure 2B:
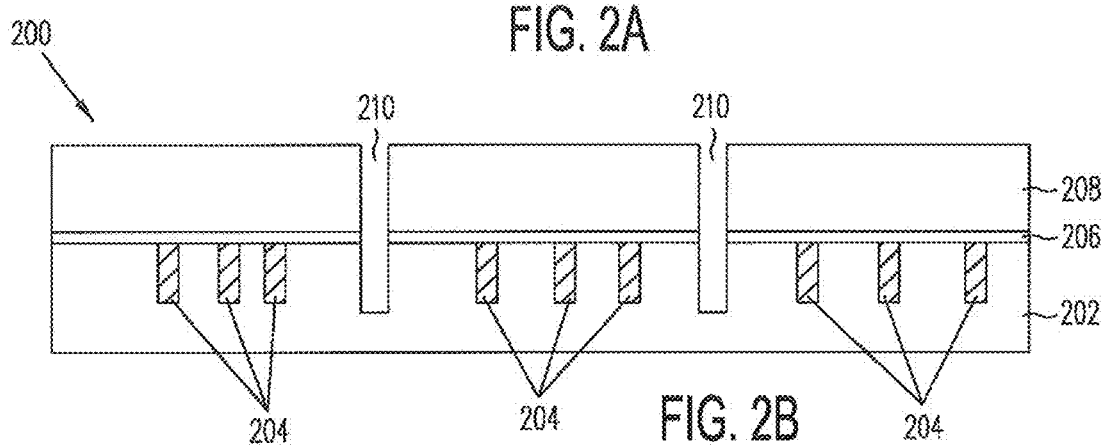

As shown in FIG. 1, a cavity etch step 104 is performed on device substrate 200. As illustrated in FIG. 2B, an etch mask 208 is formed over layer 206 and device substrate 200 is etched through mask 208 to form crack arrests 210. In some embodiments, as shown in FIG. 2B, crack arrests 210 are formed at least as deep into substrate 202 as are vias 204. In some embodiments, crack arrests 210 are etched as deeply as are vias 204. Mask 208 can then be removed from over layer 206.

Figure 2C:
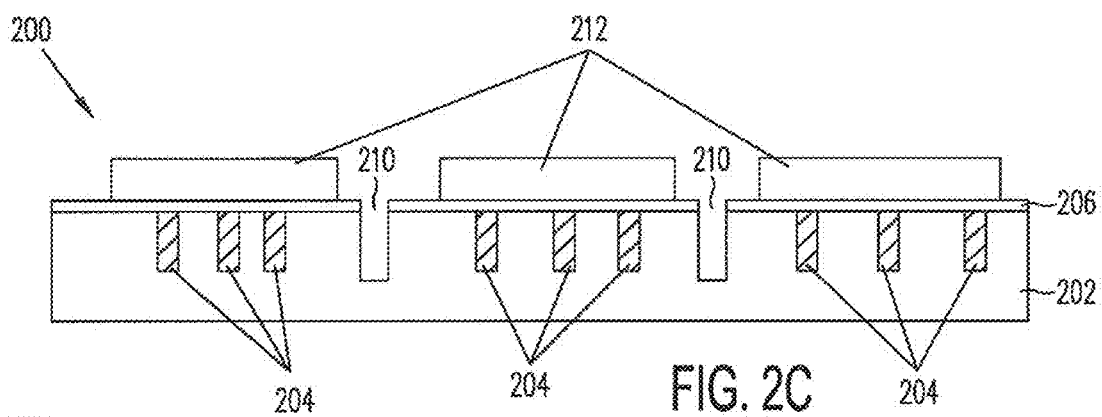
Figure 2D:
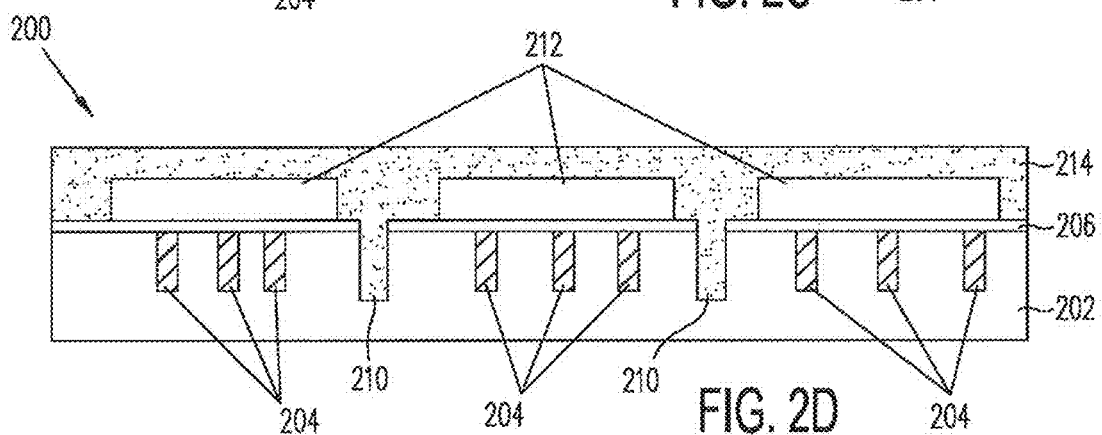
Figure 2E:
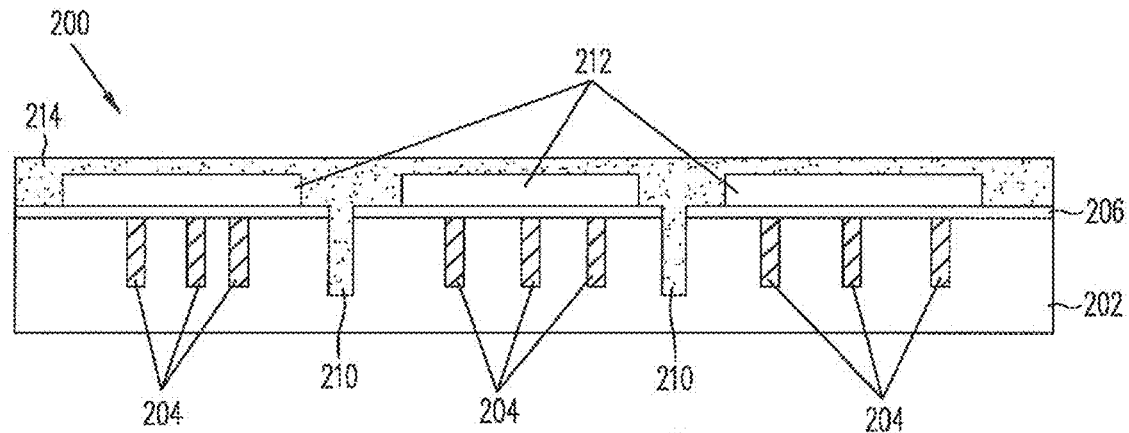

In step 106 of process 100, as illustrated in FIG. 2C, a chip device 212 is mounted over layer 206. Layer 206 provides for interconnects between chip device 212 and vias 204. In step 108, as illustrated in FIG. 2D, an encapsulation layer 214 is deposed over chip device 212 and layer 206 such that crack arrests 210 are filled and chip devices 212 are encapsulated between encapsulation layer 214 and layer 206. In step 110 of process 100, as illustrated in FIG. 2E, encapsulation layer 214 can be planarized so that its thickness is reduced. Encapsulation layer 214, however, still encapsulates chip devices 212. Encapsulation material for layer 214 can be a low coefficient of thermal expansion (CTE) dielectric material. In some embodiments, crack arrests 210 can be coated with a thin insulating layer such as TaN or TiN and encapsulation material for layer 214 can be a hard material such as aluminum oxide or other such material.

Figure 2F:
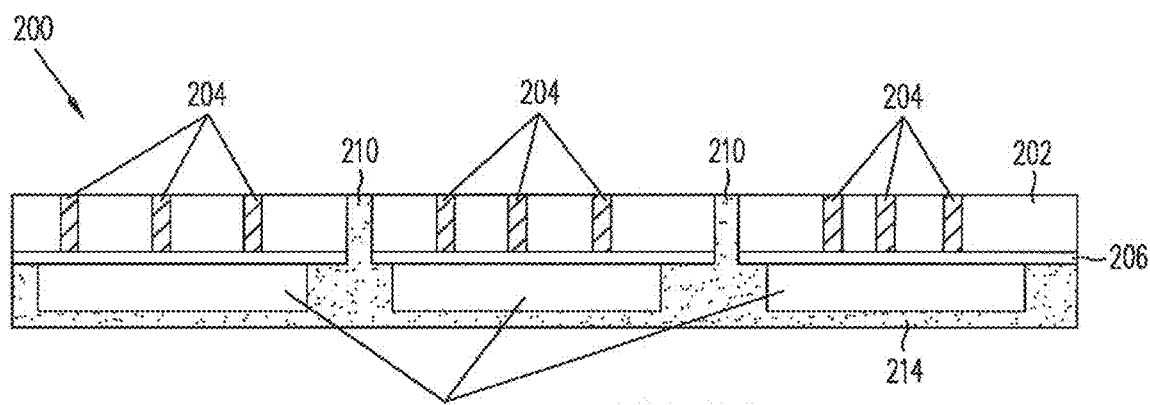

In step 112 of process 100, as illustrated in FIG. 2F, substrate 202 (the backside of substrate device 200) is ground and planarized to expose vias 204. In some embodiments, as is shown in FIG. 2F, crack arrests 210 filled with encapsulation material of layer 214 are also exposed to form isolation bridges. Embodiments where crack arrests 210 are not exposed in step 112 are discussed starting with FIG. 2J below.

Figure 2G:
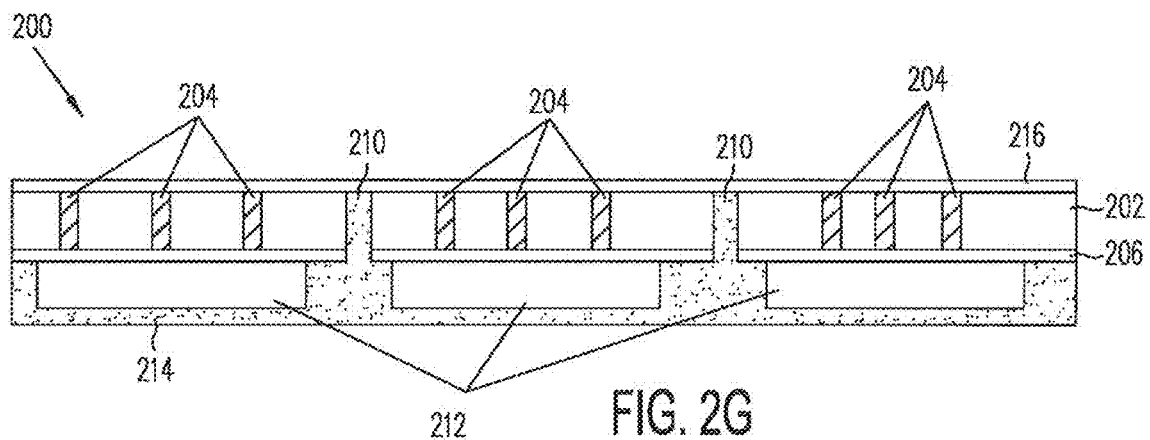

In step 114, as illustrated in FIG. 2G, an RDI layer 216 can be formed in contact with vias 204.

Figure 2H:
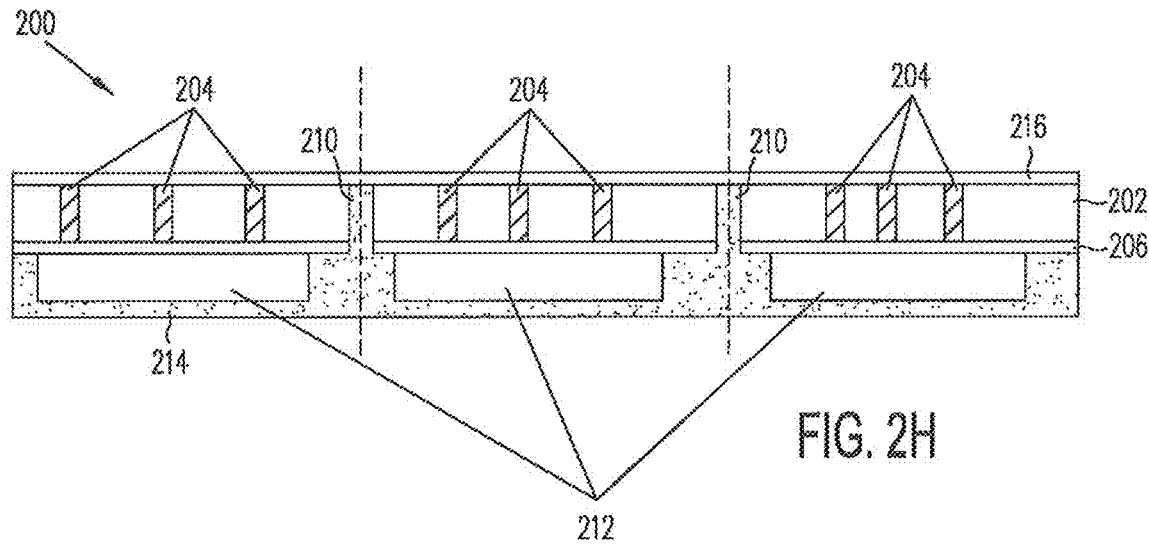
Figure 2I:
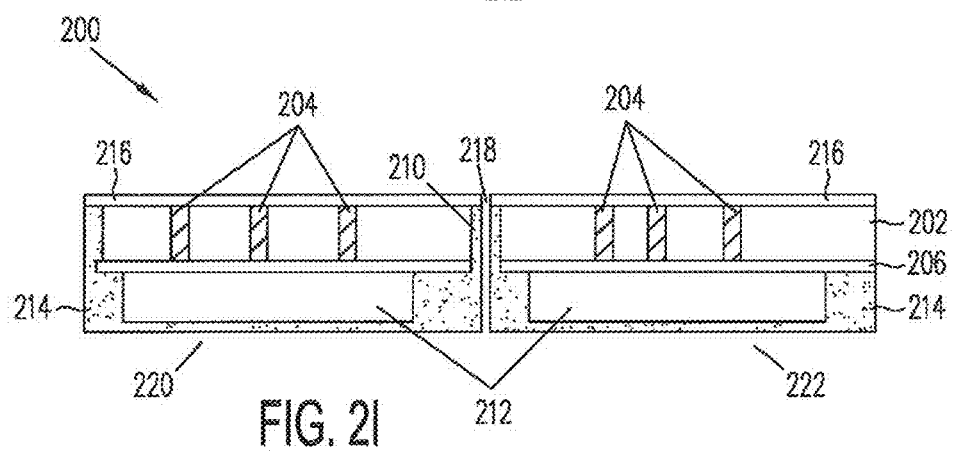
Figure 2J:
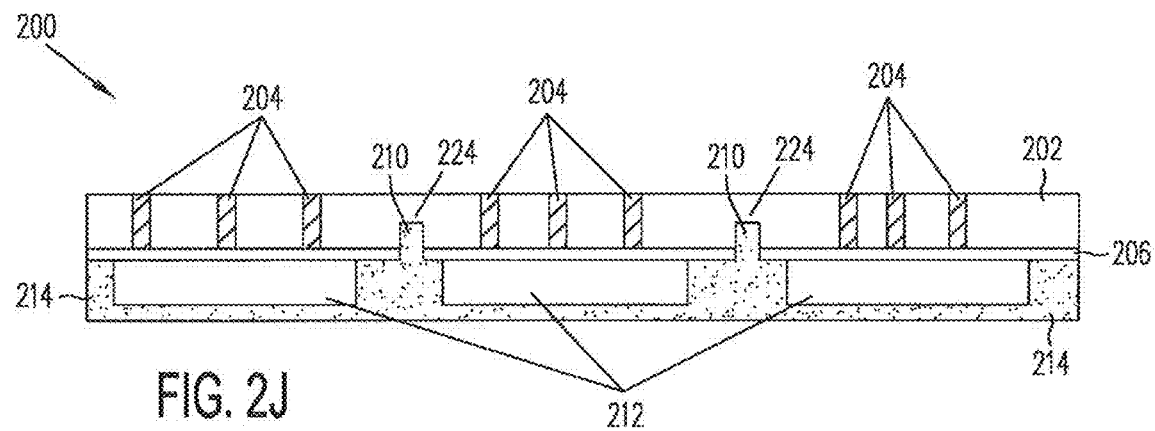

As shown in step 116 and illustrated in FIG. 2H, a singulation process is performed to split substrate device 200 along crack arrests 210. As such, as is shown in FIG. 2I, two devices 220 and 222 are separated by cut 218 through crack arrests 210. Returning to step 112 of process 100, in some embodiments crack arrests 210 are not exposed. As shown in FIG. 2J, if crack arrests 210 are not formed as deeply into substrate 202 as is vias 204, a substrate bridge 224 is formed during planarization. In such a case, crack arrests 210, filled with encapsulation material of encapsulation layer 214, are separated from the plane formed by the exposed vias 204 by a remainder of substrate material of substrate layer 202 to form the substrate bridge 224.

Figure 2K:
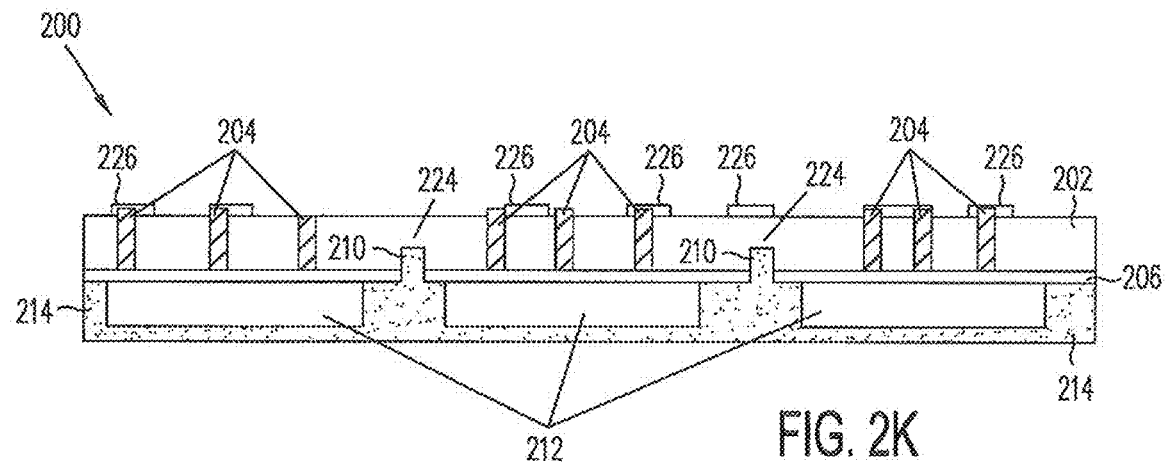
Figure 2L:
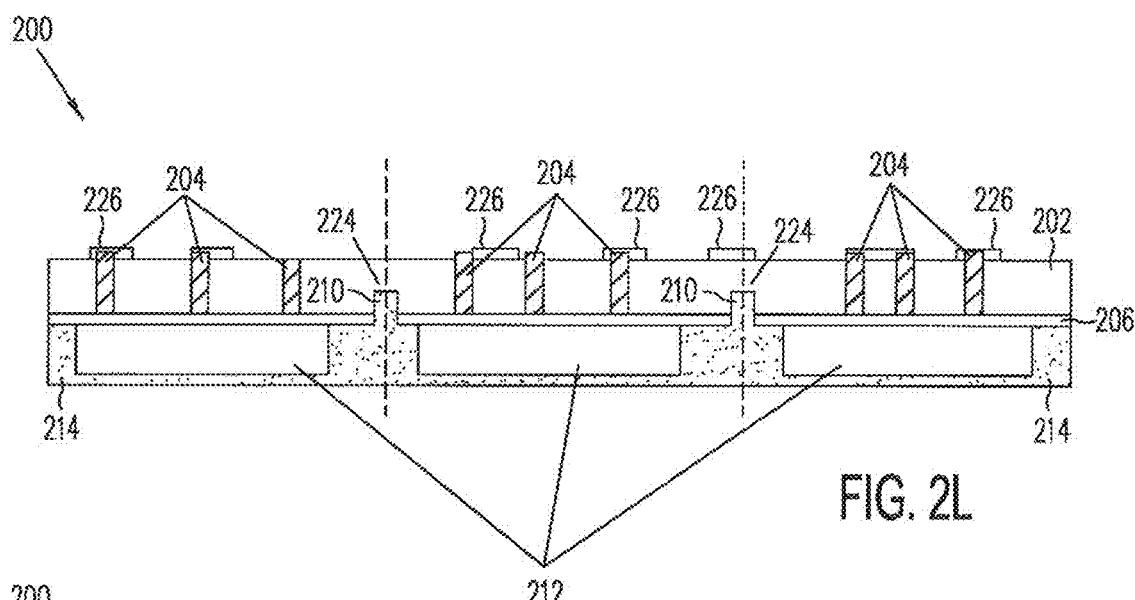
Figure 2M:
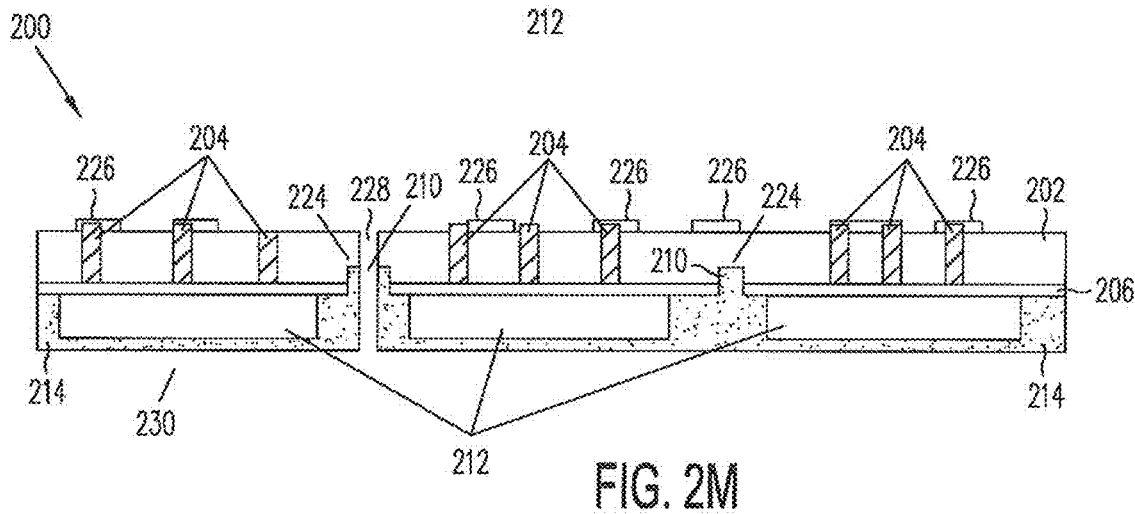

In step 114, as shown in FIG. 2K, an RDI layer or bonding layer 226 can be formed. As shown in step 116 and illustrated in FIG. 2L, a singulation process is performed to split substrate device 200 along crack arrests 210. As such, as is shown in in FIG. 2M, a device 230 is formed by a cut 228 through crack arrests 210.

Forming crack arrests 210 in device substrate 200 and then encapsulating chip devices 212 with encapsulation layer 214 protects chip devices 212 and substrate device 200 from cracking and warping throughout the assembly process. Further, such processes help to thermally manage the process so that thermal effects do not add to the warpage and cracking of the components.

Figure 3:
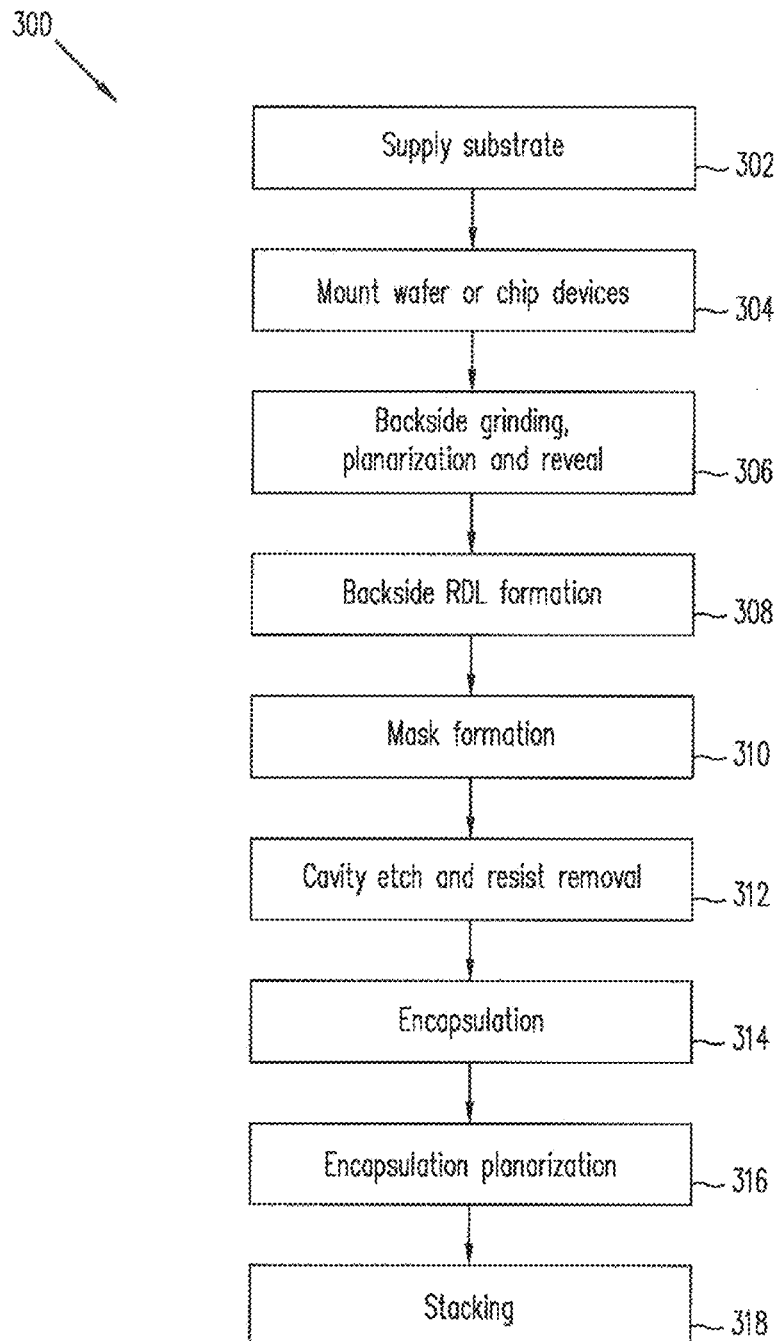
FIG. 3 illustrates a process for stacking devices according to some embodiments.
Figure 4A:
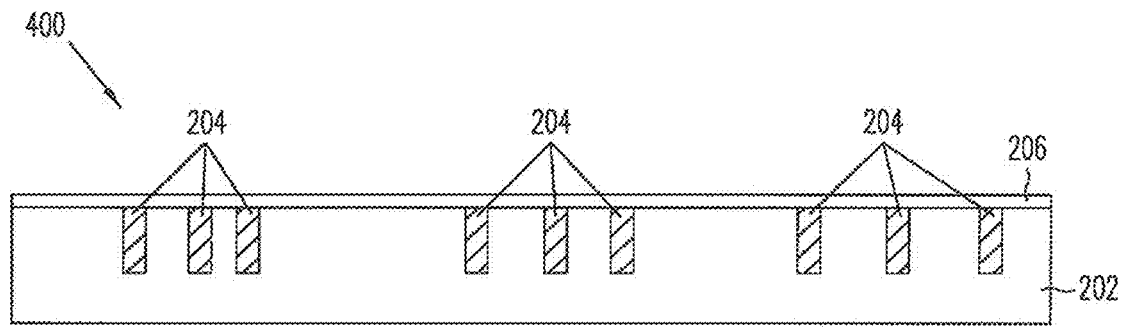
FIGS. 4A through 4I illustrate further the process of stacking illustrated in FIG. 3.

FIG. 3 illustrates a process 300 that illustrates some further aspects of embodiments of the present invention. As shown in FIG. 3, process 300 starts at step 302 with substrate device 400. As shown in FIG. 4A, substrate device 400 may be the same as substrate device 200 shown in FIG. 2A and may include a substrate 202, vias 204, and an RDL layer 206.

Figure 4B:
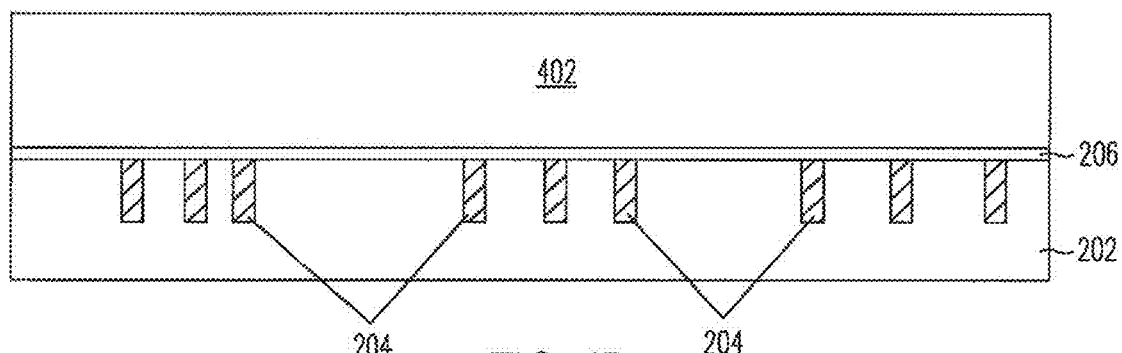

In step 304 a wafer or chip device may be mounted on RDL layer 206. FIG. 4B illustrates a wafer 402 mounted on RDL layer 206. However, one or more chip devices may be mounted as well. Wafer 402 may represent any combination of other vias and chips mounted on RDL layer 206.

Figure 4C:
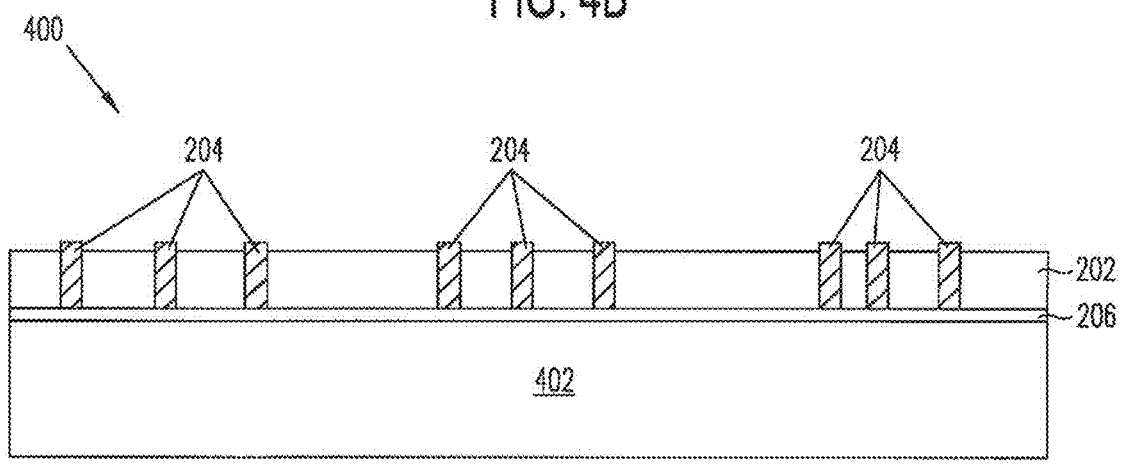
Figure 4D:
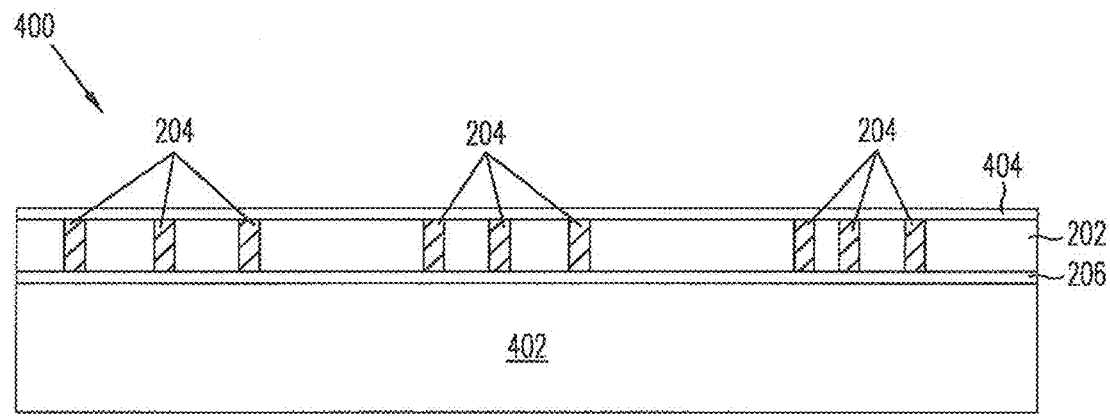

In step 306, the backside of substrate device 400 may be ground to planarize the device and reveal vias 204, as is shown in FIG. 4C. As is illustrated in FIG. 4C, substrate 202 is ground to reveal vias 204. In step 308, and as illustrated in FIG. 4D, an RDL layer 404 may be deposited in contact with the exposed vias 204. In some embodiments, RDL layer 404 may be omitted.

Figure 4E:
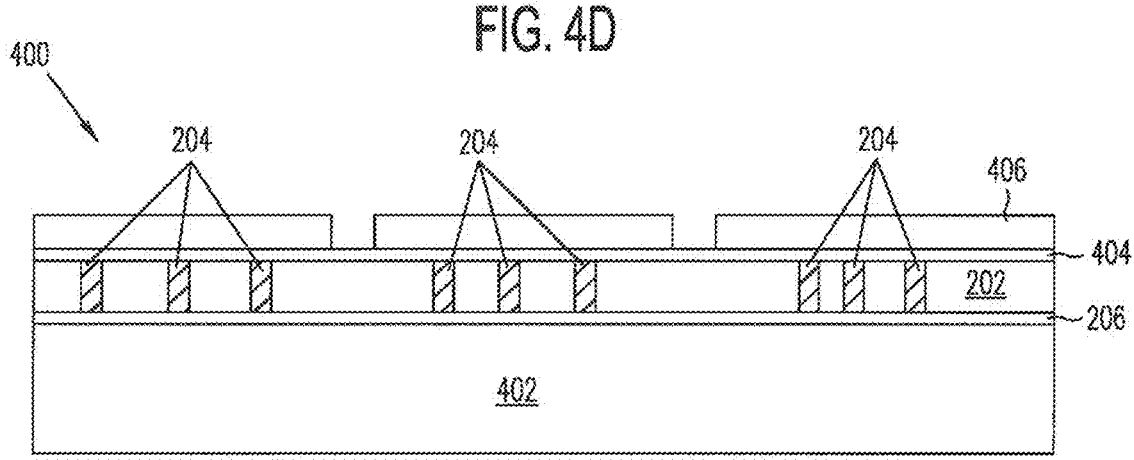
Figure 4F:
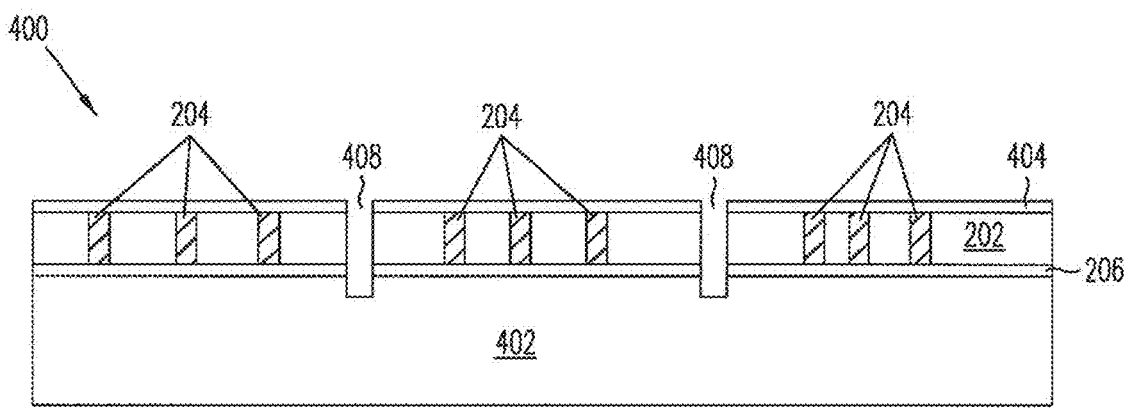
Figure 4G:
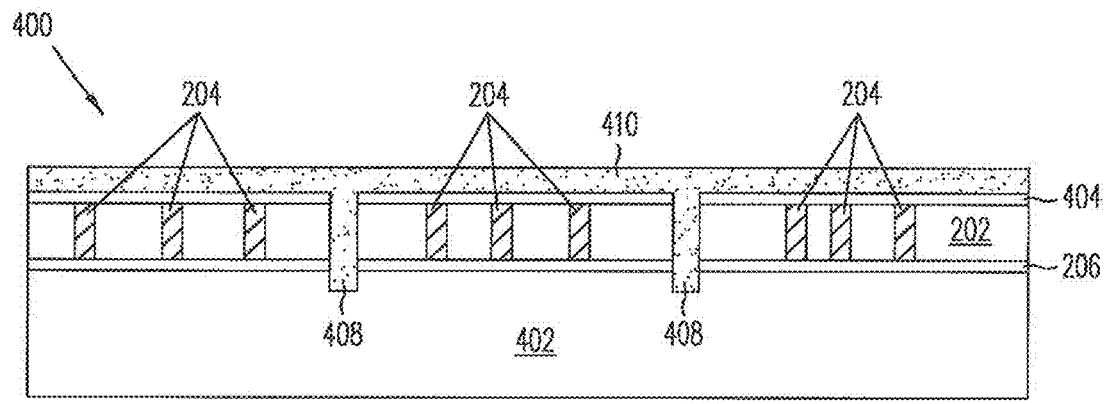

In step 310, and as shown in FIG. 4E, a mask 406 may be formed on RDL layer 404. Mask 406 may be formed by patterning a resist deposited over RDL layer 404. In step 312, and as shown in FIG. 4F, substrate device 400 is etched through mask 406 to form crack arrests 408. Mask layer 406 can then be removed. In some embodiments, chip devices (not shown) can be mounted to RDL layer 404.

In step 314, and as shown in FIG. 4Q an encapsulation layer 410 is deposited on RDL layer 404 and filling crack arrests 408. If any chip devices are mounted on RDL layer 404, then encapsulation layer 410 can encapsulated the mounted chip devices.

Figure 4H:
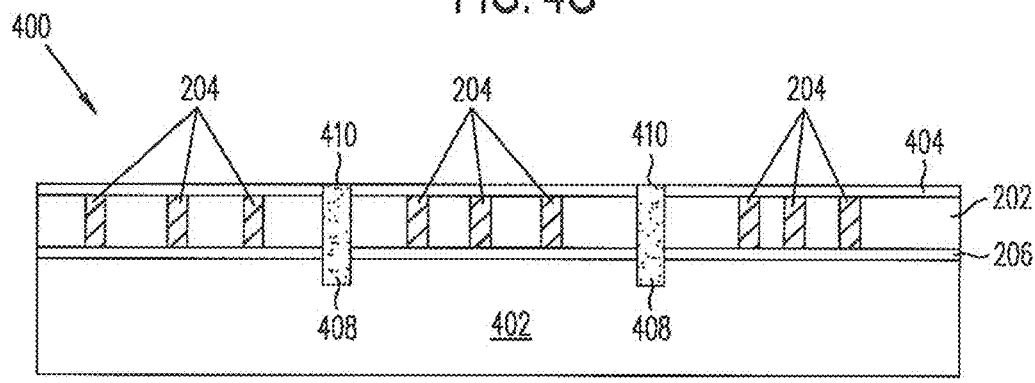
Figure 4I:
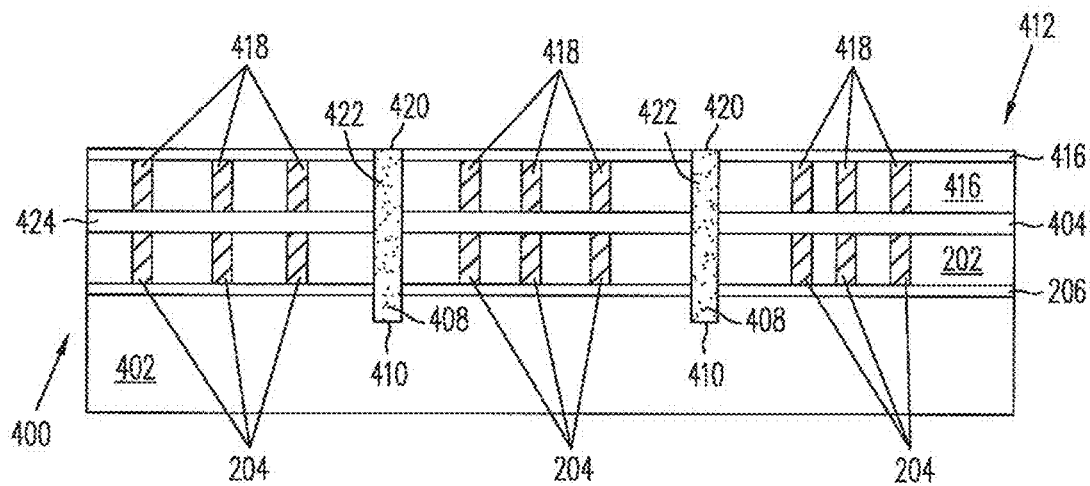

In step 316, and as illustrated in FIG. 4H, the encapsulation layer 410 can be removed to RDL layer 404, or if any chip devices are mounted on RDL layer 404 to the chip devices, or if RDL layer 404 is absent to expose vias 204. In step 318, as shown in FIG. 4I another substrate device 412 can be stacked with substrate device 400. As shown in FIG. 4I, substrate device 412 can include a substrate 404 with RDL layers 412 and 424 and with vias 418 formed between RDL layers 412 and 424. Further, crack arrests 420 filled with encapsulation material 422 are formed. Substrate device 412 is mounted to substrate device 400 such that RDL layer 424 contacts RDL layer 404. As such, substrate device 412 can be formed similarly to substrate device 400 except that wafer 402 is absent.

As shown in process 300, in some embodiments multiple layers can be stacked and backside etching can be performed. It should be noted that aspects of process 300 can be included in process 100 in order to stack multiple components. Further, the stacked combination of substrate device 412 with substrate device 400 can be separated by cutting through crack arrests 420 and crack arrest 410.

In the preceding specification, various embodiments have been described with reference to the accompanying drawings. It will, however, be evident that various modifications and changes may be made thereto, and additional embodiments may be implemented, without departing from the broader scope of the invention as set for in the claims that follow. The specification and drawings are accordingly to be regarded in an illustrative rather than restrictive sense.

What is claimed is:

1. A stacked device comprising:
 a first semiconductor element having a first upper surface, a first lower surface, and a first side surface extending between the first upper surface and the first lower surface;
 a second semiconductor element stacked on the first semiconductor element, the second semiconductor element having a second upper surface, a second lower surface, and a second side surface extending between the second upper surface and the second lower surface;

an interconnection layer disposed between the first upper surface of the first semiconductor element and the second lower surface of the second semiconductor elements, the interconnection layer having a third upper surface, a third lower surface, and a third side surface extending between the third upper surface and the third lower surface; and an encapsulation layer extending along the first side surface of the first semiconductor element, the second side surface of the second semiconductor element, and the third side surface of the interconnection layer.

2. The stacked device of claim 1, further comprising a plurality of metallic vias disposed through the second semiconductor element from the second upper surface to the second lower surface of the second semiconductor element.

3. The stacked device of claim 2, further comprising a second plurality of metallic vias disposed through the first semiconductor element.

4. The stacked device of claim 1, wherein the encapsulation layer seamlessly and continuously extends across the respective first, second, and third side surfaces of the first semiconductor element, the second semiconductor element, and the interconnection layer.

5. The stacked device of claim 1, wherein the encapsulation layer further extends over the second upper surface of the second semiconductor element, the second upper surface transverse to the second side surface of the second semiconductor element.

6. The stacked device of claim 1, wherein the first side surface of the first semiconductor element is laterally inset relative to the second side surface of the second semiconductor element.

7. The stacked device of claim 1, wherein a lateral footprint of the first semiconductor element is less than a lateral footprint of the second semiconductor element.

8. The stacked device of claim 1, wherein the first side surface of the first semiconductor element is flush with the second side surface of the second semiconductor element.

9. The stacked device of claim 8, wherein the first side surface of the first semiconductor element, the second side surface of the second semiconductor element, and the third side surface of the interconnection layer comprise etched surfaces.

10. The stacked device of claim 8, wherein the first upper surface and the second lower surface are mounted to the interconnection layer, and wherein the encapsulation layer extends from the second major lateral surface of the first semiconductor element to the second major lateral surface of the second semiconductor element.

11. The stacked device of claim 10, further comprising a second interconnection layer on the second upper surface of the second semiconductor element.

12. The stacked device of claim 11, further comprising a third semiconductor element, the first semiconductor element stacked on the third semiconductor element.

13. The stacked device of claim 1, wherein the third side surface of the interconnection layer is flush with the respective first and second side surfaces of one of the first and second semiconductor elements.

14. The stacked device of claim 1, wherein the third side surface of the interconnection layer is flush with the respective first and second side surfaces of both the first and second semiconductor elements.

15. The stacked device of claim 1, wherein a side surface of the encapsulation layer comprises a cut surface that is flush across the first and second semiconductor elements.

16. The stacked device of claim 1, wherein at least one of the first and second semiconductor elements comprises a chip device.

17. The stacked device of claim 1, wherein the interconnection layer comprises a back end-of-line layer (BEOL).

18. The stacked device of claim 1, wherein the interconnection layer comprises a redistribution layer (RDL).

19. A stacked device comprising:
a first semiconductor element;
a second semiconductor element stacked on the first semiconductor element, the second semiconductor element comprising a plurality of metallic vias disposed through the second semiconductor element, the first and second semiconductor element comprising respective first and second major lateral surfaces, the respective first major lateral surfaces facing one another and the respective second major lateral surfaces facing away from one another, each of the first and second semiconductor elements comprising a respective side surface extending between the respective first and second major lateral surfaces; and
an encapsulation layer extending along the respective side surfaces of the first semiconductor element and the second semiconductor element, the encapsulation layer extending from the second major lateral surface of the first semiconductor element to the second major lateral surface of the second semiconductor element.

20. The stacked device of claim 19, further comprising an interconnection layer disposed between the first and second semiconductor elements.

21. The stacked device of claim 19, wherein at least one of the first and second semiconductor devices comprises a chip device.

22. The stacked device of claim 19, wherein the side surface of the first semiconductor element is laterally inset relative to the side surface of the second semiconductor element.

* * * * *